United States Patent
Weng et al.

(10) Patent No.: US 8,664,680 B2
(45) Date of Patent: Mar. 4, 2014

(54) COLOR FILTER STRUCTURE AND METHOD FOR FABRICATING THE SAME

(75) Inventors: Fu-Tien Weng, Hsinchu (TW); Chieh-Yuan Cheng, Hsinchu (TW); Han-Lin Wu, Hsinchu (TW)

(73) Assignee: VisEra Technologies Company Limited, Hsinchu Science Park (TW)

( * ) Notice: Subject to any disclaimer, the term of this patent is extended or adjusted under 35 U.S.C. 154(b) by 140 days.

(21) Appl. No.: 13/350,073

(22) Filed: Jan. 13, 2012

(65) Prior Publication Data
US 2013/0180949 A1 Jul. 18, 2013

(51) Int. Cl.
*H01L 33/00* (2010.01)
*H01L 21/00* (2006.01)
*H01L 27/146* (2006.01)
*H01L 31/0216* (2006.01)

(52) U.S. Cl.
CPC ..... *H01L 27/14621* (2013.01); *H01L 31/02162* (2013.01)
USPC .............................. 257/98; 438/70

(58) Field of Classification Search
CPC ............ H01L 27/14621; H01L 27/322; H01L 31/02162
USPC ................................ 438/70; 257/98
See application file for complete search history.

(56) References Cited

U.S. PATENT DOCUMENTS 7,129,108 B2 * 10/2006 Jang ................................ 438/70

* cited by examiner

*Primary Examiner* — William D Coleman
(74) *Attorney, Agent, or Firm* — Muncy, Geissler, Olds & Lowe, P.C.

(57) ABSTRACT

A method for fabricating a color filter structure includes: providing a base layer; forming a first colored layer on the base layer; patterning the first colored layer to form a pair of first colored patterns, a first opening between the first colored patterns, and a second opening adjacent to the first colored patterns; forming a first dielectric layer on the first colored patterns and the base layer exposed by the first and second openings; forming a second colored layer on the first colored patterns and the first dielectric layer; patterning the second colored layer to form a second colored pattern in the first opening; forming a second dielectric layer on the first dielectric layer and the second colored pattern; forming a third colored layer on the second dielectric layer; and patterning the third colored layer to form a third colored pattern in the second opening.

21 Claims, 12 Drawing Sheets

COLOR FILTER STRUCTURE AND METHOD FOR FABRICATING THE SAME

BACKGROUND OF THE INVENTION

1. Field of the Invention

The invention relates to image sensing devices, and more particularly to a color filter structure having improved resolution and reduced cross-talk issues for an image sensing device.

2. Description of the Related Art

Image sensors are necessary components in many optoelectronic devices, including digital cameras, cellular phones, and toys. Conventional image sensors include both charge coupled device (CCD) image sensors and complementary metal oxide semiconductor (CMOS) image sensors. An image sensor typically includes a plane array of pixel cells, wherein each pixel cell comprises a photogate, photoconductor or a photodiode having a doped region for accumulating a photo-generated charge.

In addition, a periodic pattern of different colors is superimposed over the plane array of pixel cells. This periodic pattern of different colors is known as a color filter array (CFA). The periodic pattern of different colors is typically made of I-line photosensitive materials such as dye-type photosensitive materials or pigment-type photosensitive materials, such that formation of the periodic pattern of different colors is typically achieved by photolithography processes. The pigment-type photosensitive materials, however, show poor resolution performance in the photolithography processes when compared with the dye-type photosensitive materials. The dye-type photosensitive materials, however, show poor chemical duration in the photolithography processes when compared with the pigment-type photosensitive materials. Therefore, accurate definition of the periodic pattern in the color filter array, however, is problematic and becomes more critical as a size thereof is further reduced to, for example, a sub-micron size. Moreover, the resolution limitation of I-line photolithography tools for performing the photolithography processes to the I-line photosensitive materials of the color filter array is also limited as a size thereof is further reduced to, for example, a sub-micron size.

BRIEF SUMMARY OF THE INVENTION

Therefore, a method for fabricating a color filter structure having improved resolution and alignment accuracy for an image sensing device is provided.

An exemplary method for fabricating a color filter structure comprises: providing a base layer; forming a first colored layer on the base layer; patterning the first colored layer to form a pair of first colored patterns on the base layer, a first opening between the pair of first colored patterns, and a second opening adjacent to the pair of the first colored patterns; forming a first dielectric layer on the pair of the first colored patterns and the base layer exposed by the first and second openings; forming a second colored layer on the pair of first colored patterns and the first dielectric layer; patterning the second colored layer to form a second colored pattern in the first opening; forming a second dielectric layer on the first dielectric layer and the second colored pattern; forming a third colored layer on the second dielectric layer; and patterning the third colored layer to form a third colored pattern in the second opening.

Another exemplary method for fabricating a color filter structure comprises: (a) forming a dielectric layer; (b) forming a colored layer over the dielectric layer; (c) forming a hard mask pattern over the colored layer; (d) patterning the colored layer by the hard mask pattern to form a colored pattern; (e) removing the hard mask pattern; (f) repeating steps (a)-(e); and repeating steps (a)-(e).

A color filter structure with improved resolution and alignment accuracy for an image sensor is also provided. An exemplary color filter structure comprises: a pair of first colored patterns; a second colored pattern between the pair of first colored patterns; a third colored pattern adjacent to the pair of first colored patterns; a first dielectric layer on the pair the first colored patterns; and a second dielectric layer on the first dielectric layer and the second colored pattern.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1-4 are schematic cross sections showing an exemplary method for fabricating an image sensing device.

Figure 1:
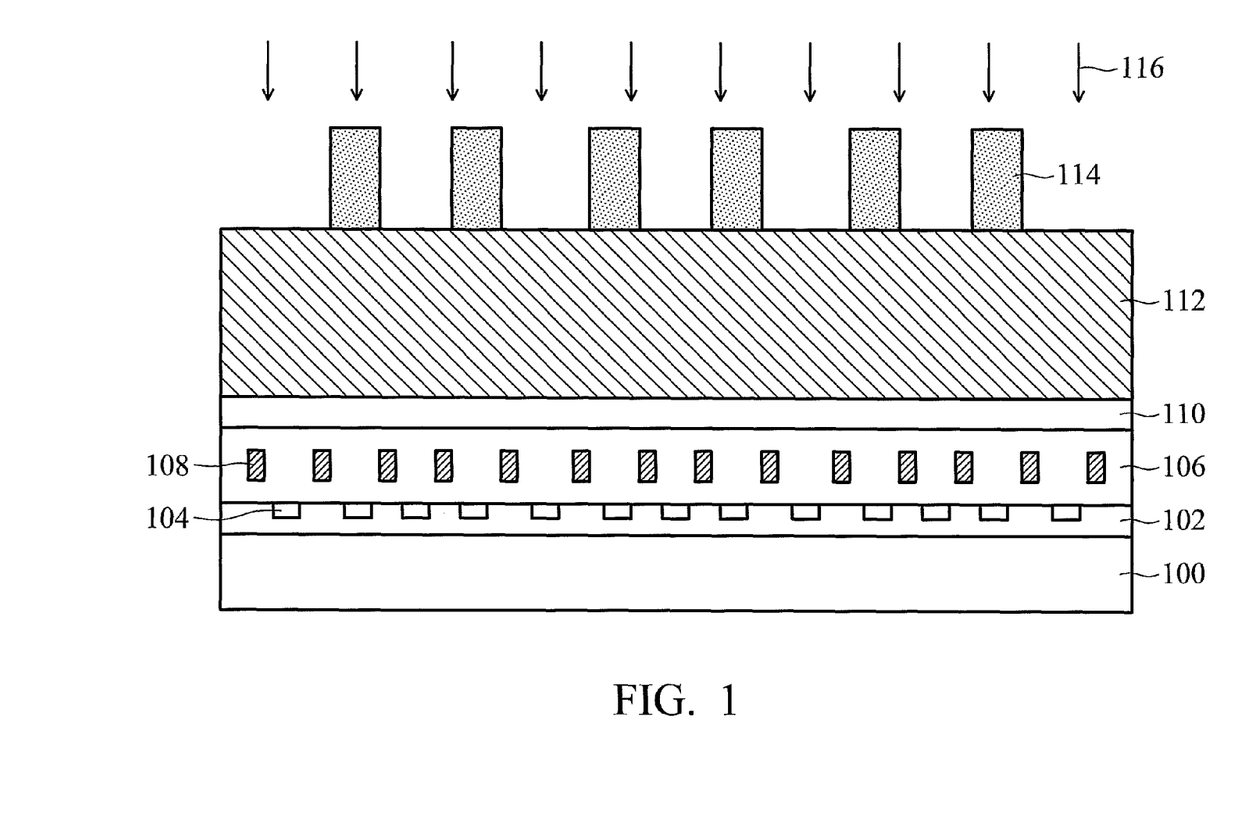
FIGS. 1-4 are schematic cross sections showing a method for fabricating an image sensing device according to an embodiment of the invention.

In FIG. 1, a substantially fabricated image sensing structure is first provided, including a semiconductor substrate 100, an active layer 102 with a plurality of photo-sensing elements 104 formed therein over the substrate 100, and a passivation layer 106 with a plurality of light shielding metals 108 formed therein formed over the active layer 102. The photo-sensing elements 104 can be, for example, photodiodes or CMOS sensing elements, and are separately formed in the active layer 102, and the light shielding metals 108 formed in the passivation layer 106 are formed over the active layer 102 at a place not covering the photo-sensing elements 104 to define light-shielding areas for shielding the area of the pixel except for the area of the photo-sensing elements 104.

Next, a dielectric layer 110 is formed over the passivation layer 106. The dielectric layer 110 may be formed with a thickness less than 50 Å and may comprise materials such as silicon oxide. The dielectric layer 110 is a light transmitting layer and may have a refraction index (N) of about 1.4-1.6, and is formed by a deposition process such as chemical vapor deposition (CVD) process under a temperature not greater 200° C. Next, a colored layer 112 is formed over the dielectric layer 110. The colored layer 112 may comprise non-photosensitive type color resists, and may be formed by, for example, spin coating. The colored layer 112 may have a thickness of about 5000-10000 Å. Next, a plurality of hard mask patterns 114 is separately formed over the colored layer 112. The hard mask patterns 114 may comprise photosensitive materials other than I-line photosensitive materials, and are formed by a photolithography process (not shown), thereby forming the plurality of hard mask patterns 114 over the dielectric layer 110. As shown in FIG. 1, the hard mask patterns 114 are formed with rectangular shapes. Next, a patterning process 116 such as dry etching process is performed to the colored layer 112, using the hard mask patterns 114 as an etching mask.

Figure 2:
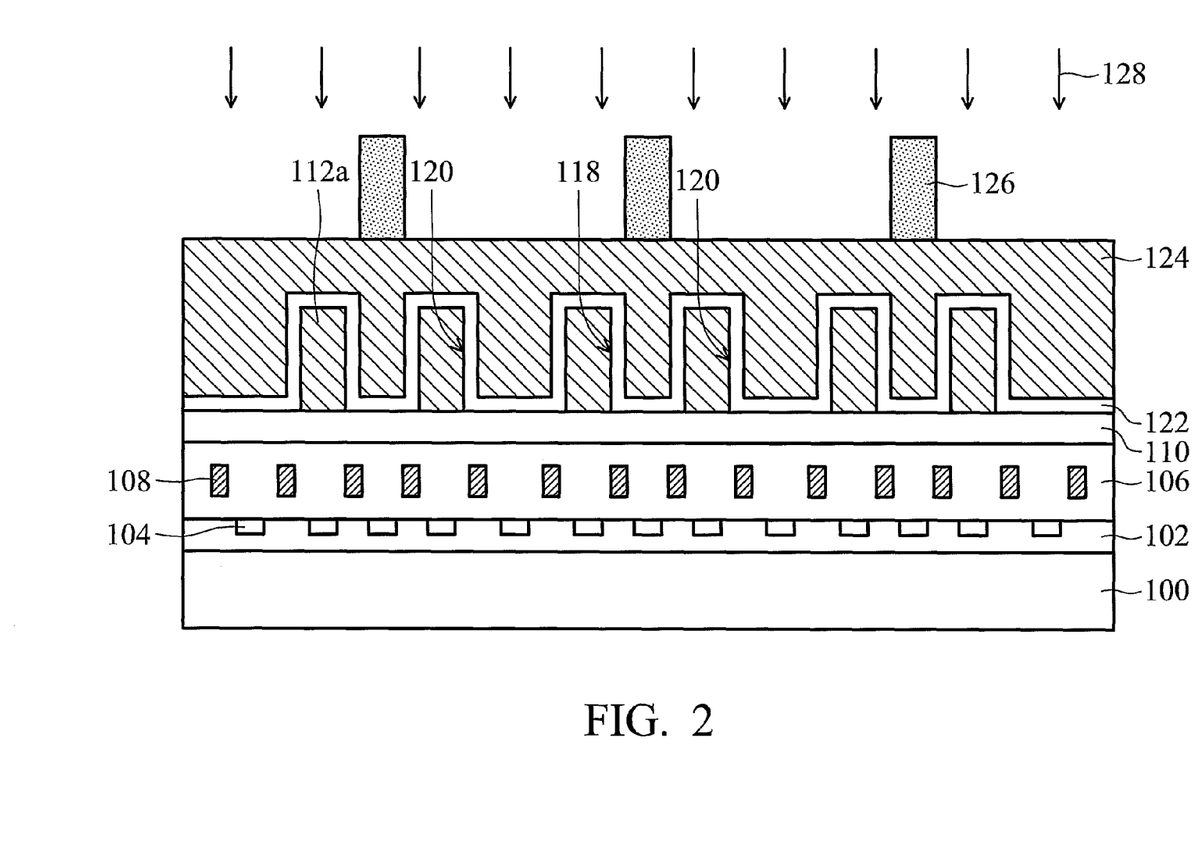

In FIG. 2, after the patterning process 116, a plurality of colored patterns 112a are separately formed over the dielectric layer 110, and the underlying passivation layer 106 is protected by the dielectric layer 110 and not etched during the patterning process 116. The colored patterns 112a are respectively formed over one of the photo-sensing elements 104, and every two of the colored patterns 112a can be divided into a sub-group. Therefore, each sub-group of the colored patterns 112 may have an opening 118 formed between the colored patterns 112a therein, and an opening 120 is formed between two adjacent sub-groups of the colored patterns 112a. Next, a dielectric layer 122 is formed over the colored patterns 112a and the dielectric layer 110. The dielectric layer 122 may be formed with a thickness less than 50 Å and may comprise materials such as silicon oxide. The dielectric layer 122 is a light transmitting layer and may have a refraction index (N) of about 1.4-1.6, and is formed by a deposition process such as chemical vapor deposition (CVD) process under a temperature not greater 200° C. Next, a colored layer 124 is formed over the dielectric layer 122. The colored layer 124 may comprise non-photosensitive type color resists, and may be formed by, for example, spin coating. The colored layer 124 may have a thickness of about 5000-10000 Å. Next, a plurality of hard mask patterns 126 is separately formed over the colored layer 124. The hard mask patterns 126 may comprise photosensitive materials other than I-line photosensitive materials, and can be formed by a photolithography process (not shown), thereby forming the plurality of hard mask patterns 126 over the colored layer 124. The hard mask patterns 126 are formed with rectangular shapes. As shown in FIG. 2, the hard mask patterns 126 are respectively formed at a place substantially over the openings 118. Next, a patterning process 128 such as dry etching process is performed to the colored layer 124, using the hard mask patterns 126 as an etching mask.

Figure 3:
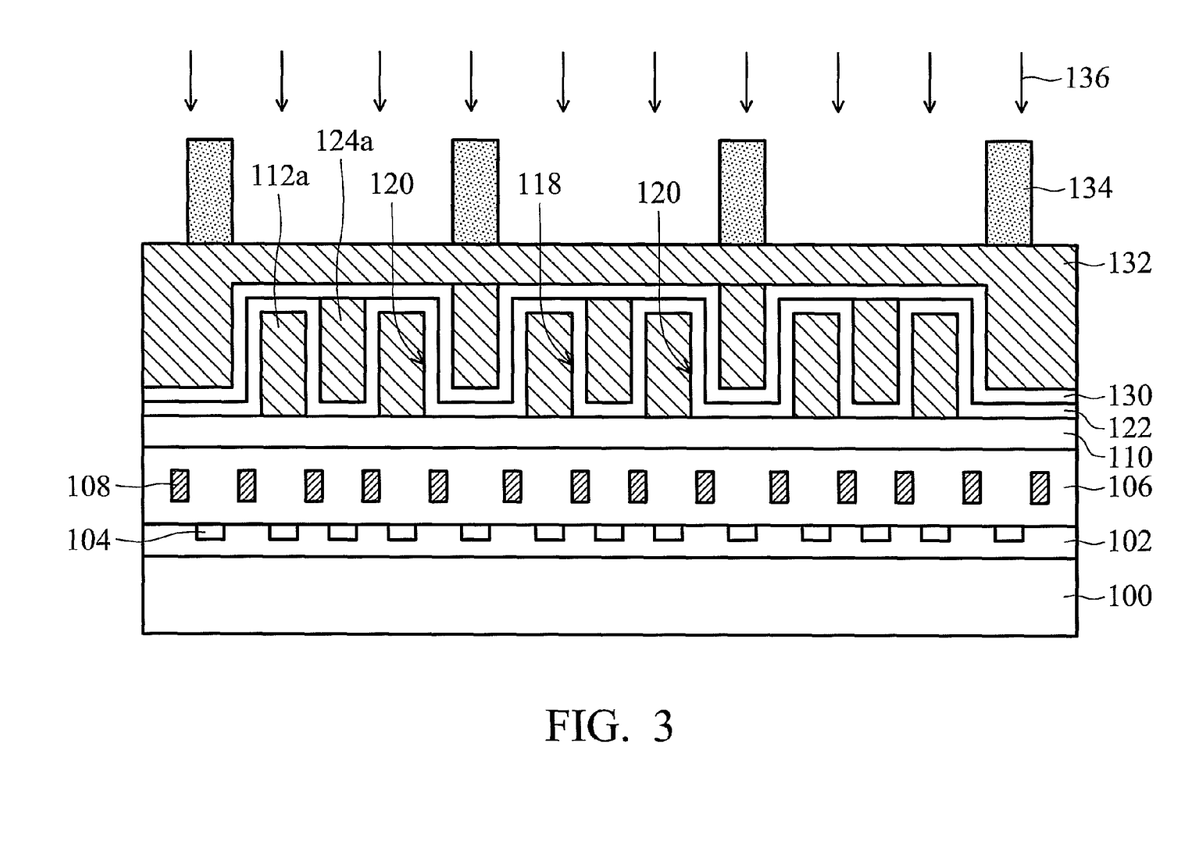

In FIG. 3, after the patterning process 128, a plurality of colored patterns 124a are separately formed over the dielectric layer 122 and respectively formed in one of the openings 118. The colored patterns are also respectively formed over one of the photo-sensing elements 104 thereunder. The underlying colored patterns 112a are not etched and are protected by the dielectric layer 122 during the patterning process 128. Next, a dielectric layer 130 is formed over the dielectric layer 122, covering the colored patterns 124a. The dielectric layer 130 may be formed with a thickness less than 50 Å and may comprise materials such as silicon oxide. The dielectric layer 130 is a light transmitting layer and may have a refraction index (N) of about 1.4-1.6, and is formed by a deposition process such as chemical vapor deposition (CVD) process under a temperature not greater 200° C. Next, a colored layer 132 is formed over the dielectric layer 130. The colored layer 132 may comprise non-photosensitive type color resists, and may be formed by, for example, spin coating. The colored layer 132 may have a thickness of about 5000-10000 Å. Next, a plurality of hard mask patterns 134 is separately formed over the colored layer 132. The hard mask patterns 134 may comprise photosensitive materials other than I-line photosensitive materials and can be formed by a photolithography process (not shown), thereby forming the plurality of hard mask patterns 134 over the colored layer 132. As shown in FIG. 3, the hard mask patterns 134 are respectively formed at a place substantially over the openings 120 and are formed of rectangular shapes. Next, a patterning process 136 such as dry etching process is performed to the colored layer 132, using the hard mask patterns 134 as an etching mask.

Figure 4:
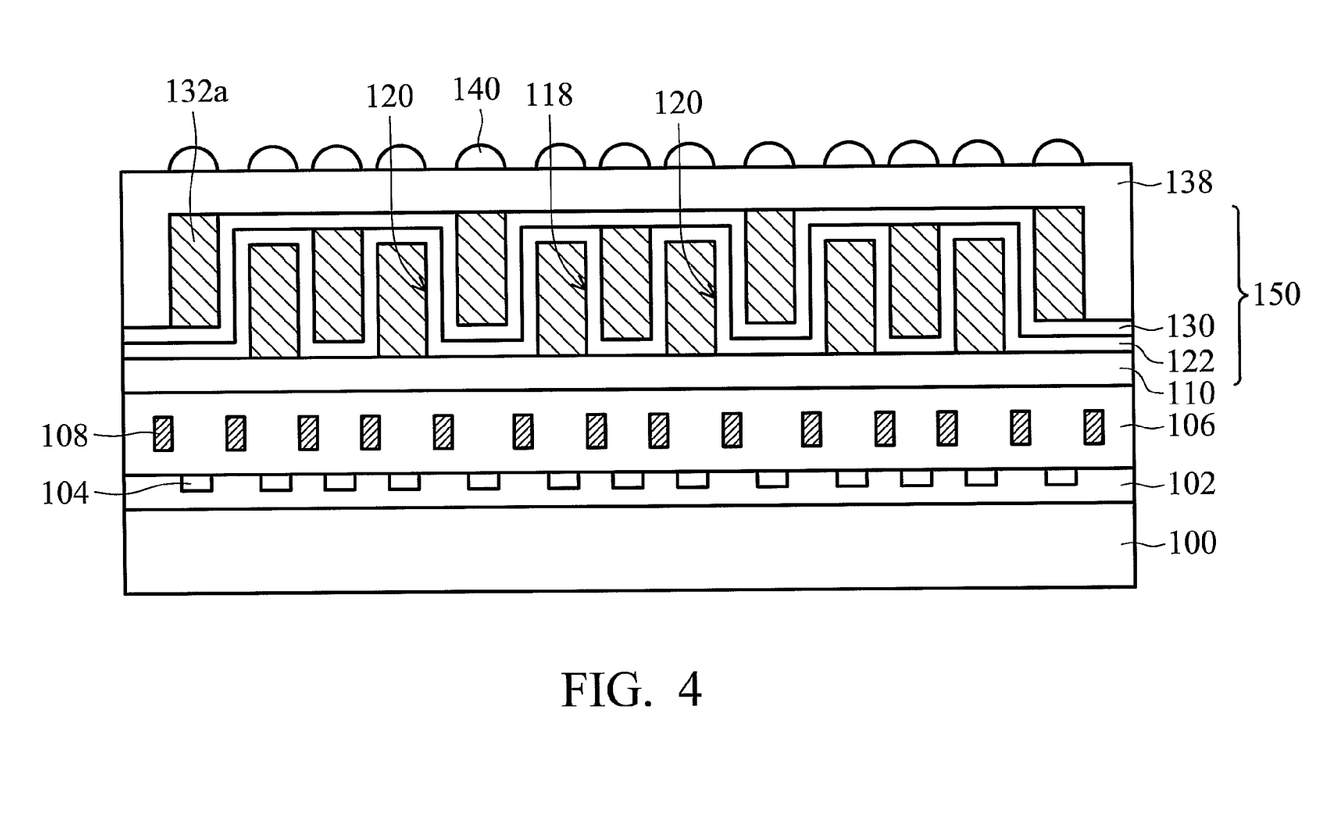

In FIG. 4, after the patterning process 136, a plurality of colored patterns 132a are separately formed over the dielectric layer 130 and respectively formed in one of the openings 120. The colored patterns 132a are also respectively formed over one of the photo-sensing elements 104 thereunder. The underlying colored patterns 124a and the dielectric layer 122 are not etched and are protected by the dielectric layer 130 during the patterning process 136. Next, a spacer layer 130 is formed over the dielectric layer 130, covering the colored patterns 132a. The spacer layer 130 may be formed with a thickness of about 1000-6000 Å and may comprise materials such as silicon oxide. After formation of the spacer layer 138, a planar top surface for sequential processing is provided, and a plurality of microlenses 140 is formed over the spacer layer 130. Each of the microlenses substantially and vertically aligns to one of the colored patterns 112a/124a/132a and one of the photo-sensing elements 104 thereunder.

In the above embodiment, the colored layers 112, 124, and 132, and the colored patterns 112a, 124a and 132a are formed of non-photosensitive type color resists and may be pigment-type color resists or dye-type color resists. The colored layers 112, 124, and 132, and the colored patterns 112a, 124a and 132a are formed of different colors, and may comprise different colors selected from a group consisting of green, blue and red, or from a group consisting of cyan, magenta and yellow, thereby forming an overall color mosaic matrix. The colored patterns 112a, 124a and 132a are patterned by the hard mask patterns 114, 126, and 134 made of photosensitive materials rather than I-line photosensitive materials, such that improved resolution and alignment accuracy thereof can be achieved when compared with the directing patterning of the colored layers made of the conventional I-line photoresists. In one embodiment, the patterning processes 116, 128 and 136 can be, for example, a dry etching process using $O_2$ as an etching gas, such that undesired organic residue issues after patterning of the colored layers 112, 124 and 132 can be thus eliminated. In this embodiment, combination of the colored patterns 112a, 124a and 132a, and the dielectric layers 122 and 130 provides a color filtering structure for an image sensing device, and the color filter structure is formed with improved resolution and alignment accuracy.

FIGS. 5-9 are schematic cross sections showing another exemplary method for fabricating an image sensing device which is modified from the embodiment illustrated in FIGS. 1-4.

Figure 5:
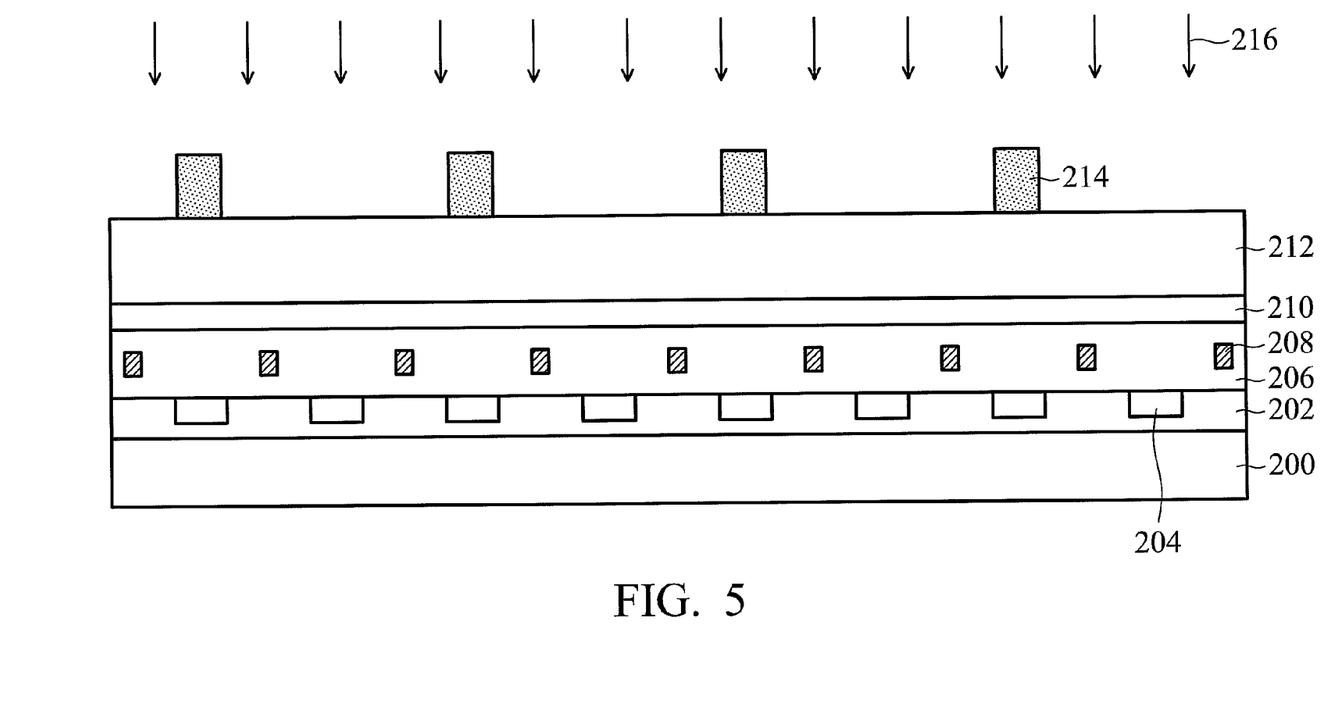
FIGS. 5-9 are schematic cross sections showing a method for fabricating an image sensing device according to another embodiment of the invention.

In FIG. 5, a substantially fabricated image sensing structure is first provided, including a semiconductor substrate 200, an active layer 202 with a plurality of photo-sensing elements 204 formed therein over the substrate 200, and a passivation layer 206 with a plurality of light shielding metals 208 formed therein formed over the active layer 202. The photo-sensing elements 204 can be, for example, photodiodes or CMOS sensing elements, and are separately formed in the active layer 202, and the light shielding metals 208 formed in the passivation layer 206 formed over the active layer 202 at a place not covering the photo-sensing elements 204 therein to define light-shielding areas for shielding the area of the pixel except for the area of the photo-sensing elements 204.

Next, a dielectric layer 210 is formed over the passivation layer 206. The dielectric layer 210 may be formed with a thickness less than 50 Å and may comprise materials such as silicon oxide. The dielectric layer 210 is a light transmitting layer and may have a refraction index (N) of about 1.4-1.6, and is formed by a deposition process such as chemical vapor deposition (CVD) process under a temperature not greater 200° C. Next, a colored layer 212 is formed over the dielectric layer 210. The colored layer 212 may comprise non-photosensitive type color resists, and may be formed by, for example, spin coating. The colored layer 212 may have a thickness of about 5000-10000 Å. Next, a plurality of hard mask patterns 214 is separately formed over the colored layer 212. The hard mask patterns 214 may comprise photosensitive materials other than I-line photosensitive materials and are formed by a photolithography process (not shown), thereby forming the plurality of hard mask patterns 214 over the dielectric layer 210. The hard mask patterns 214 are formed with rectangular shapes. Next, a thermal process 216 such as a rapid thermal annealing (RTA) process is performed to deform a shape of the hard mask patterns 214.

Figure 6:
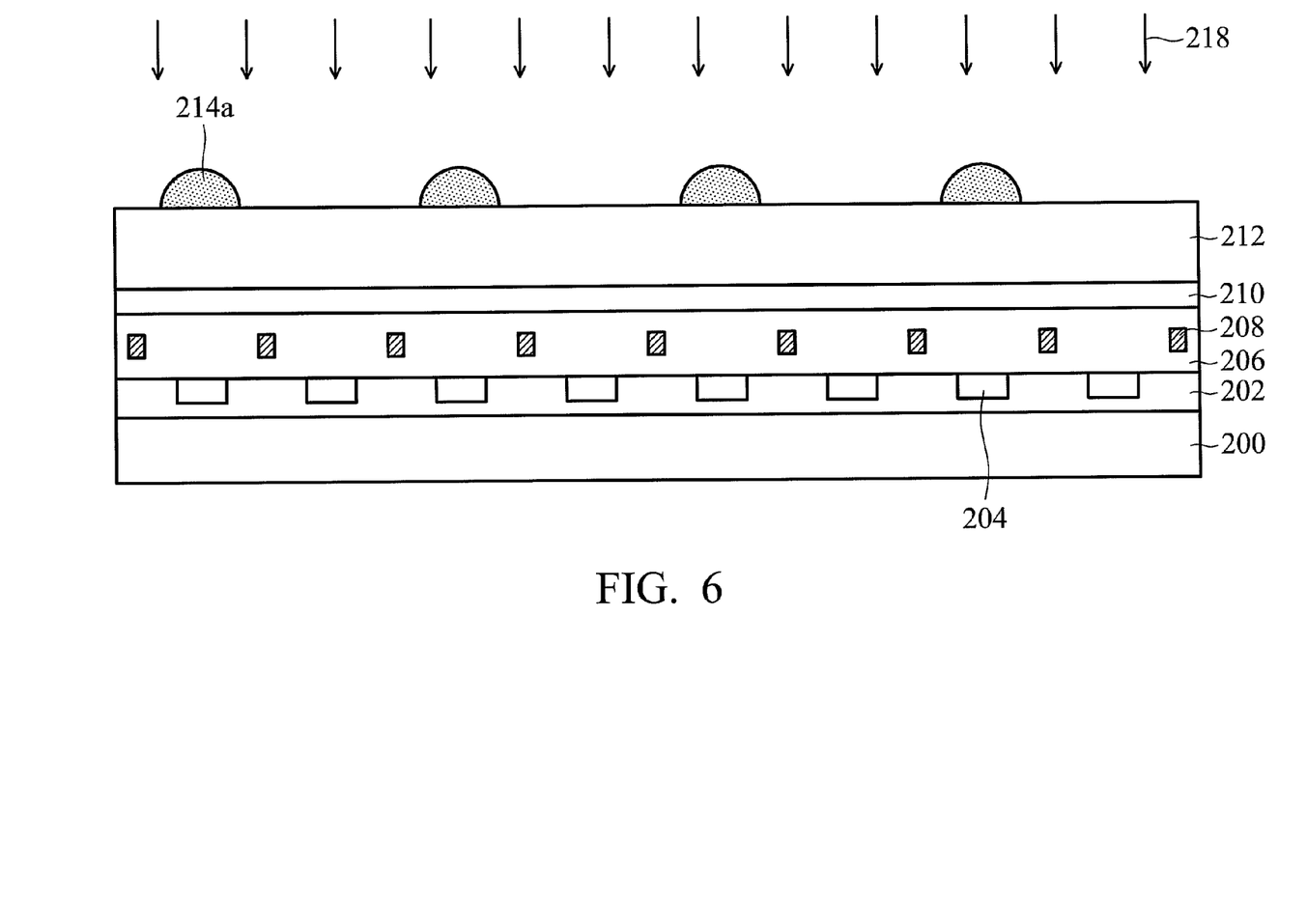

In FIG. 6, after the thermal process 216, a plurality of hard mask patterns 214a with semicircular shapes are thus formed, and a patterning process 218 such as a dry etching process is performed to the colored layer 212, using the hard mask patterns 214a as an etching mask.

Figure 7:
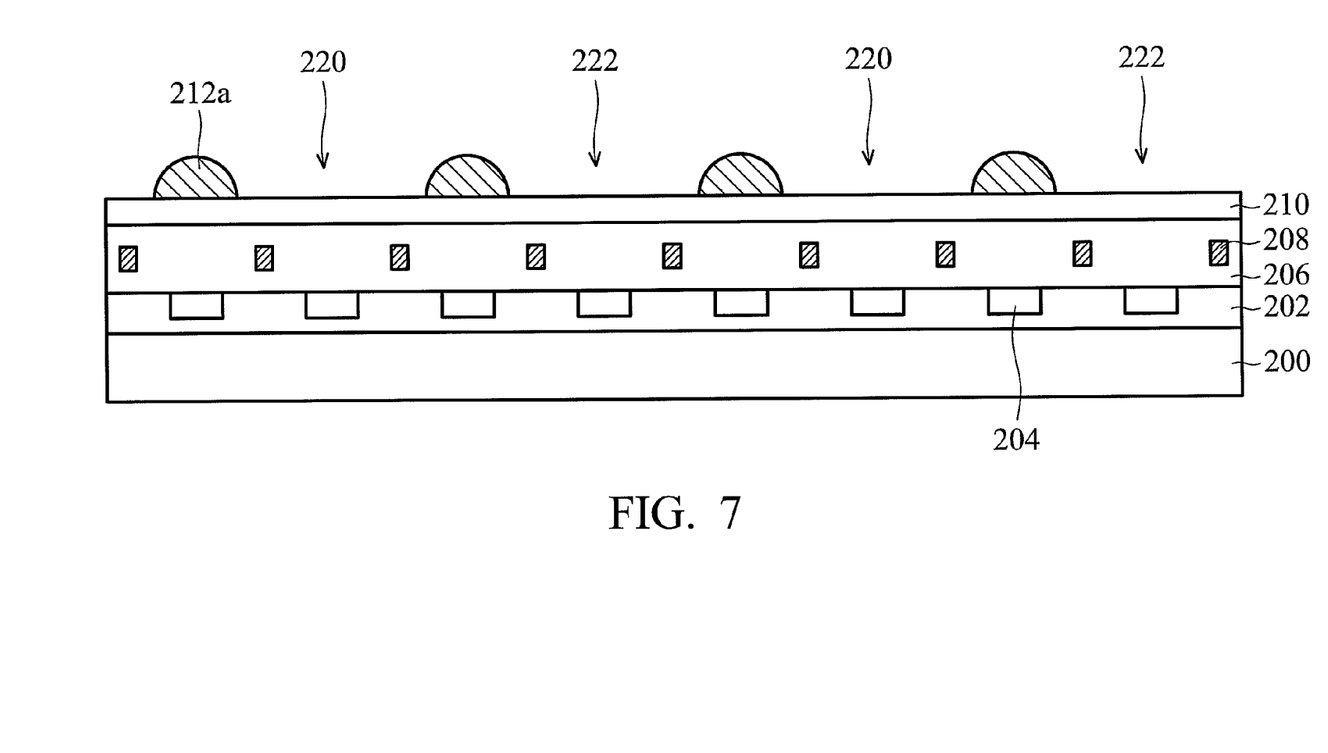

In FIG. 7, after the patterning process 218, a plurality of colored patterns 212a are separately formed over the dielectric layer 210, and the underlying passivation layer 206 is protected by the dielectric layer 210 and not etched during the patterning process 218. The colored patterns 212a are respectively formed over one of the photo-sensing elements 204, and every two of the colored patterns 212a can be divided into a sub-group. Therefore, each sub-group of the colored patterns 212 may have an opening 220 formed between the colored patterns 212a therein, and an opening 222 is formed between two adjacent sub-groups of the colored patterns 212a.

Figure 8:
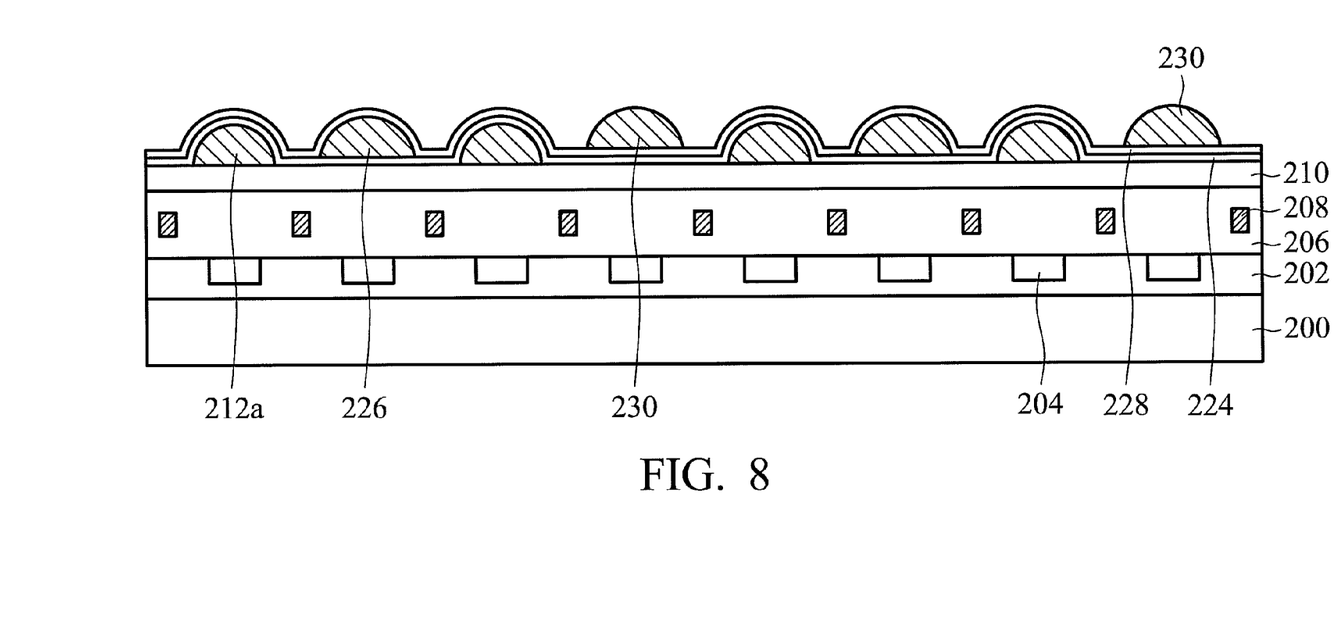

In FIG. 8, a dielectric layer 224 is formed over the substrate 200, covering the colored patterns 212a and the dielectric layer 210. The dielectric layer 224 may be formed with a thickness less than 50 Å and may comprise materials such as silicon oxide. The dielectric layer 224 is a light transmitting layer and may have a refraction index (N) of about 1.4-1.6, and is formed by a deposition process such as chemical vapor deposition (CVD) process under a temperature not greater 200° C. Next, a plurality of colored patterns 226, a dielectric layer 228, and a plurality of colored patterns 230 are sequentially formed over the dielectric layer 224 by similarly repeating the processes disclosed in FIGS. 6-7. The colored patterns 226 and 230 are also formed with semicircular shapes, and properties and functions of the dielectric layer 228 are the same as that of the dielectric layer 224. As shown in FIG. 8, the colored patterns 226 are formed in the openings 220 (shown in FIG. 7) and the colored patterns 230 are formed in the openings 222 (shown in FIG. 7).

Figure 9:
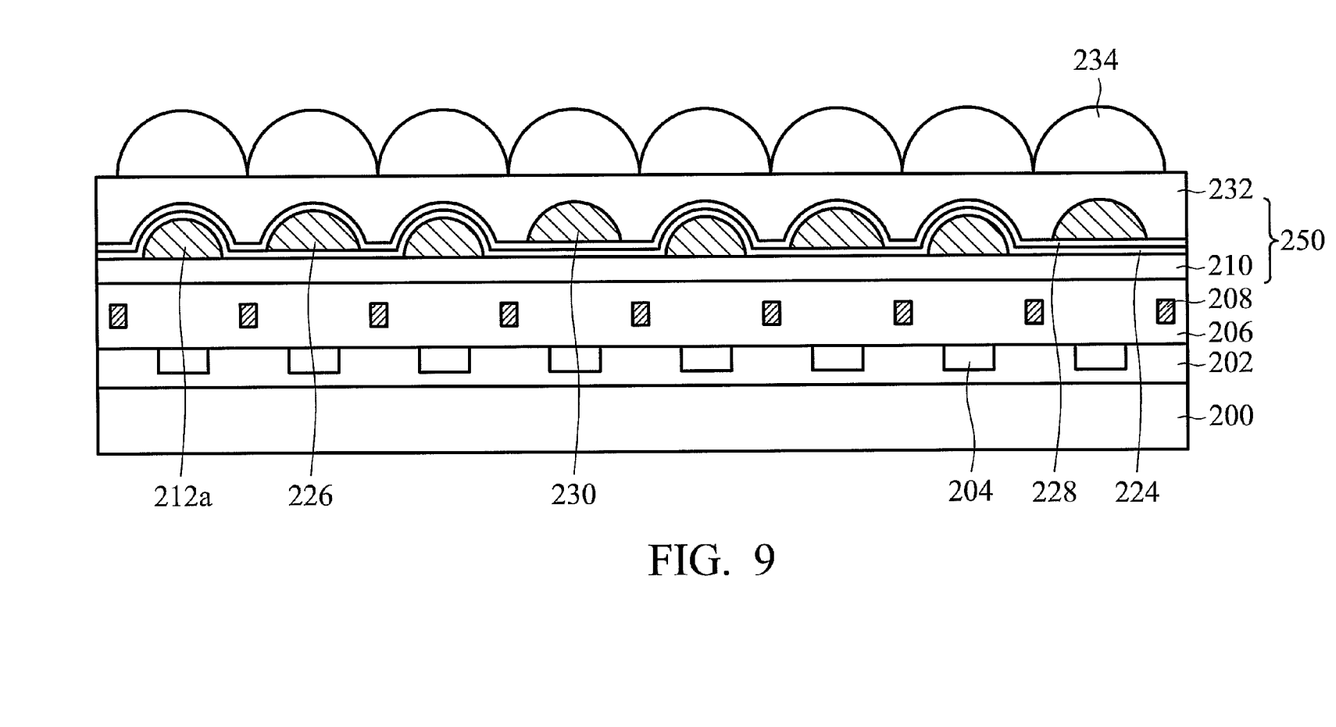

In FIG. 9, a spacer layer 232 is formed over the colored patterns 230 and the dielectric layer 228, covering the colored patterns 230. The spacer layer 232 may be formed with a thickness of about 1000-6000 Å and may comprise materials such as silicon oxide. After formation of the spacer layer 232, a planar top surface for sequential processing is provided, and a plurality of microlenses 234 is formed over the spacer layer 232. Each of the microlenses 234 substantially and vertically aligns to one of the colored patterns 212a/226/230 and one of the photo-sensing elements 204 thereunder.

In this embodiment, the colored layers for forming the colored patterns 212a, 226 and 230 are formed of non-photosensitive type color resists and may be pigment-type color resists or dye-type color resists. The colored layers for forming the colored patterns 212a, 226 and 230 are formed of different colors, and may comprise different colors selected from a group consisting of green, blue and red, or from a group consisting of cyan, magenta and yellow. The colored patterns 212a, 226 and 230 are patterned by the hard mask patterns (e.g. 214a) made of photosensitive materials rather than I-line photosensitive materials, such that improved resolution and alignment accuracy thereof can be achieved when compared with directing the patterning of the colored layers made of the conventional I-line photoresists. In one embodiment, the patterning processes (e.g. the patterning process 218) can be, for example, a dry etching process using $O_2$ as an etching gas, such that undesired organic residue issues after patterning of the colored layers for forming the colored patterns 212a, 226 and 230 can be thus eliminated. Combination of the colored patterns 212a, 226 and 230, and the dielectric layers 224 and 228 provides a color filtering structure for an image sensing device, and the color filter structure is formed with improved resolution and alignment accuracy.

Figure 10:
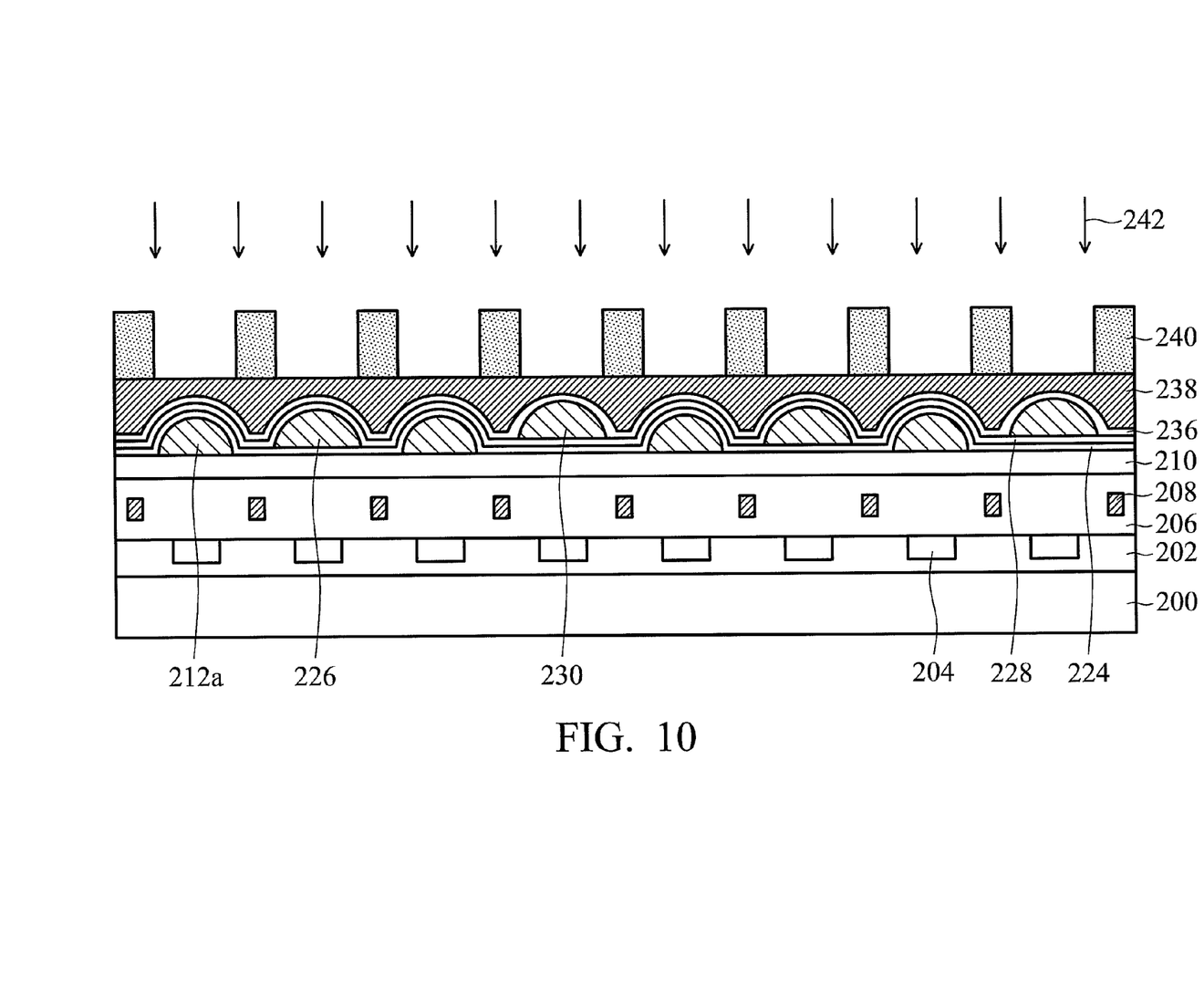
FIGS. 10-11 are schematic cross sections showing a method for fabricating an image sensing device according to yet another embodiment of the invention.
Figure 11:
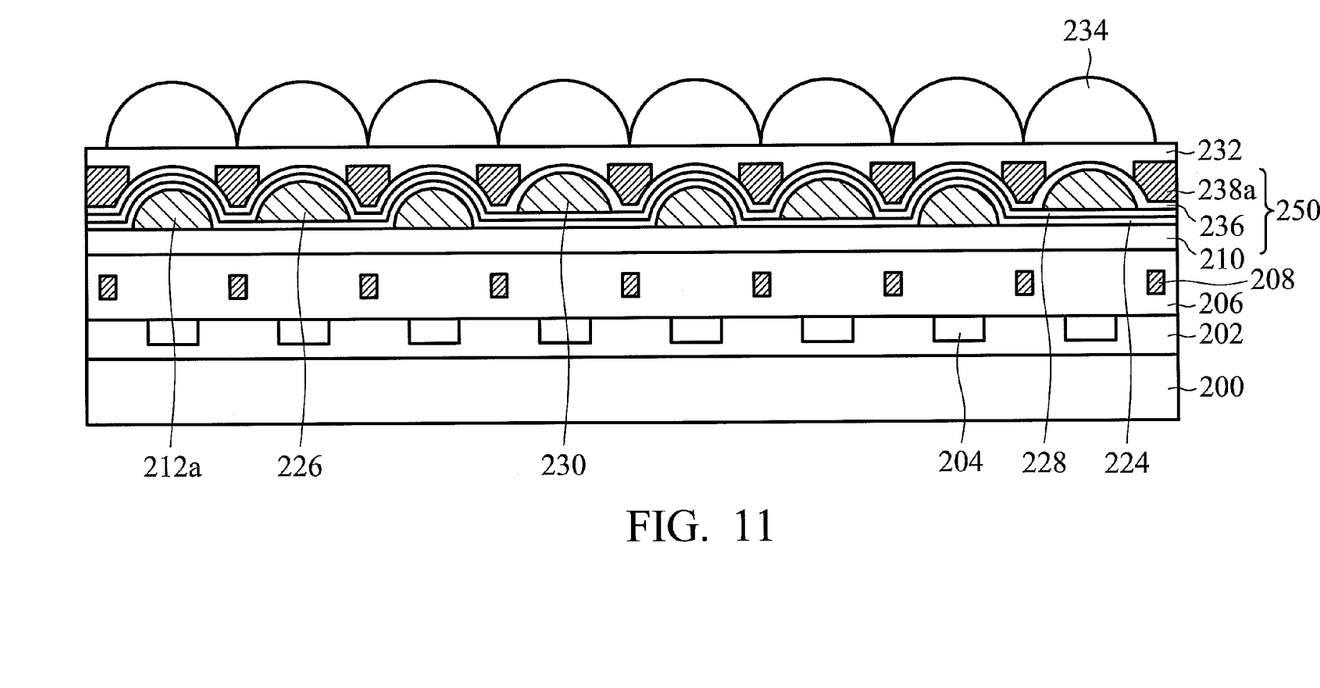

FIGS. 10-11 are schematic cross sections showing another exemplary method for fabricating an image sensing device which is modified from the embodiments illustrated in FIGS. 6-9.

In FIG. 10, the processes shown in FIG. 6-8 are performed and the structure shown in FIG. 8 is first provided. Next, a dielectric layer 236 is formed over the colored patterns 230 and the dielectric layer 228. The dielectric layer 236 may be formed with a thickness less than 50 Å and may comprise materials such as silicon oxide. The dielectric layer 236 is a light transmitting layer and may have a refraction index (N) of about 1.4-1.6, and is formed by a deposition process such as chemical vapor deposition (CVD) process under a temperature not greater 200° C. Next, a black matrix layer 238 is formed over the dielectric layer 236. The black matrix layer 238 may be formed with a thickness of about 5000-10000 Å and may comprise light-blocking materials such non-photosensitive type color resists. The non-photosensitive type color resists of the black matrix layer 238 may be pigment-type color resists or dye-type color resists. Next, a plurality of hard mask patterns 240 are separately formed over the black matrix layer 238. The hard mask patterns 240 may comprise photosensitive materials other than I-line photosensitive materials and can be formed by a photolithography process (not shown), thereby forming the plurality of hard mask patterns 240 over the black matrix layer 238. As shown in FIG. 10, the hard mask patterns 240 are respectively formed at a place substantially over one of the light-shielding metal 208 and are formed of rectangular shapes. Next, a patterning process 242 such as a dry etching process is performed to the black matrix layer 238, using the hard mask patterns 240 as an etching mask.

In FIG. 11, after the patterning process 242, a plurality of light-blocking patterns 238a are formed over the dielectric layer 236 at a place substantially aligned to one of the light-shielding metals 208 thereunder. Next, the processes disclosed in FIG. 9 are performed to form the spacer layer 232 and the microlenses 234. Each of the microlenses 234 substantially and vertically aligns to one of the colored patterns 212a/226/230 and one of the photo-sensing elements 204 thereunder.

Figure 12:
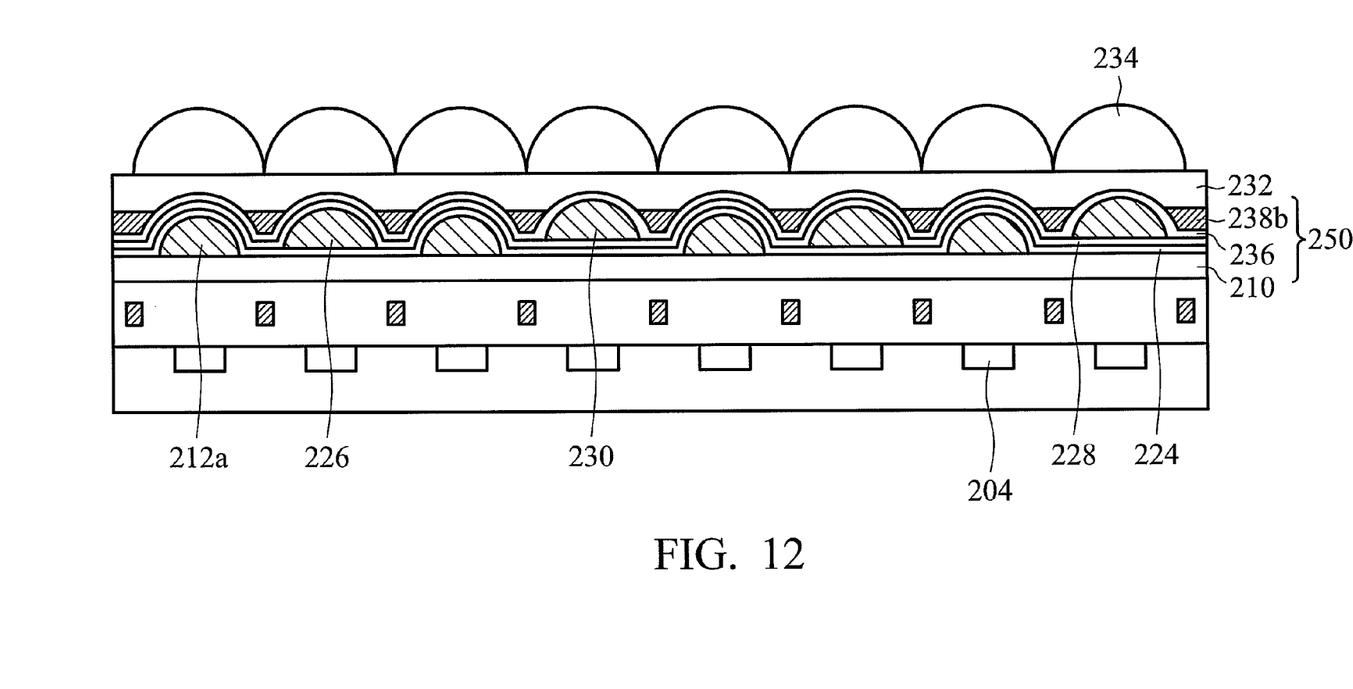
FIG. 12 is a schematic cross section showing an image sensing device according to an embodiment of the invention.

FIG. 12 is a schematic cross section showing an exemplary image sensing device formed by a method modified from that illustrated in FIGS. 10-11, and the patterning process 242 is a wet etching process performed to the black matrix layer 238 without using the hard mask patterns 240. As shown, a plurality of light-blocking patterns 238b are formed over the dielectric layer 236 at a place substantially aligned to one of the light-shielding metals 208 thereunder. In this embodiment, the light-blocking patterns 238b are formed of a tapered shape rather than the substantially rectangular shape of the light-blocking patterns 238a shown in FIG. 11.

In the embodiments shown in FIGS. 5-9, FIGS. 10-11, and FIG. 12, the colored patterns 212a, 226 and 230, and the colored layers for formation of the colored patterns 212a, 226 and 230, are formed of non-photosensitive type color resists and may be pigment-type color resists or dye-type color resists. The colored patterns 212a, 226 and 230, and the colored layers for forming the same are formed of different colors, and may comprise different colors selected from a group consisting of green, blue and red, or from a group consisting of cyan, magenta and yellow, thereby forming an overall color mosaic matrix. The colored patterns 212a, 226 and 230 are patterned by the hard mask patterns (e.g. hard mask patterns 214a in FIG. 6) made of photosensitive materials rather than I-line photosensitive materials, such that improved resolution and alignment accuracy thereof can be achieved when compared with directing the patterning of the colored layers made of the conventional I-line photoresists. In one embodiment, the patterning processes (e.g the patterning process 218) for forming the colored patterns 212a, 226 and 230 can be, for example, a dry etching process using $O_2$ as an etching gas, such that undesired organic residue issues after patterning of the colored layers to form the colored patterns 212a, 226 and 230 can be thus eliminated. In this embodiment, combination of the colored patterns 212a, 226 and 230, and the dielectric layers 224 and 228 provides a color filtering structure for an image sensing device, and the color filter structure is formed with improved resolution and alignment accuracy. Moreover, in one embodiment, with the use of the light-blocking patterns (e.g. the light-blocking patterns 238a in FIGS. 11-12), cross talk issues between adjacent photo-sensing elements (e.g. the photo-sensing elements 204 shown in FIGS. 11-12) can be thus reduced or even prevented.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a color filter structure, comprising:
   providing a base layer;
   forming a first colored layer on the base layer;
   patterning the first colored layer to form a pair of first colored patterns on the base layer, a first opening between the pair of first colored patterns, and a second opening adjacent to the pair of the first colored patterns;
   forming a first dielectric layer on the pair of the first colored patterns and the base layer exposed by the first and second openings;
   forming a second colored layer on the pair of first colored patterns and the first dielectric layer;
   patterning the second colored layer to form a second colored pattern in the first opening;
   forming a second dielectric layer on the first dielectric layer and the second colored pattern;
   forming a third colored layer on the second dielectric layer; and
   patterning the third colored layer to form a third colored pattern in the second opening.

2. The method as claimed in claim 1, wherein the first, second and third colored patterns are patterned by use of a plurality of hard mask patterns, wherein the hard mask patterns comprise photoresist material and are formed of semi-circular cross sections or rectangular cross sections.

3. The method as claimed in claim 1, further comprising:
   forming a third dielectric layer on the second dielectric layer and the third colored forming a layer of light-blocking material on the third dielectric layer; and
   patterning the layer of light-blocking material to form a plurality of light-blocking patterns.

4. The method as claimed in claim 3, wherein each of the light-blocking patterns is formed between the first and third colored patterns, and between the first and second colored patterns.

5. The method as claimed in claim 3, wherein patterning the layer of light-blocking material is achieved by wet etching.

6. The method as claimed in claim 3, wherein patterning the layer of light-blocking material is achieved by dry etching incorporating a plurality of hard mask patterns formed over the layer of the light-blocking material.

7. The method as claimed in claim 3, wherein the first, second and third dielectric layers are formed by chemical vapor deposition and the chemical vapor deposition is performed under a temperature under 200° C.

8. A color filter structure, comprising:
   a pair of first colored patterns;
   a second colored pattern between the pair of first colored patterns;
   a third colored pattern adjacent to the pair of first colored patterns;
   a first dielectric layer on the pair the first colored patterns; and
   a second dielectric layer on the first dielectric layer and the second colored pattern,
   wherein the first, second and third color resist layers comprise non-photosensitive type color resists, and the non-photosensitive type color resists comprise pigment-type color resists or dye-type color resists.

9. The color filter structure as claimed in claim 8, wherein the first, second and third colored layers comprise different colors selected from a group consisting of green, blue and red, or a group consisting of cyan, magenta and yellow.

10. The color filter structure as claimed in claim 8, wherein the first, second and third colored patterns are formed of rectangular cross sections or semi-circular cross sections.

11. The color filter structure as claimed in claim 8, further comprising a plurality of light-blocking patterns, wherein each of the light-blocking patterns is formed between the first and third colored patterns, and between the first and second colored patterns.

12. The color filter structure as claimed in claim 8, wherein the first, second and third dielectric layers are formed of a thickness less than 50 Å.

13. The color filter structure as claimed in claim 8, wherein the first, second and third dielectric layers have a refraction index of about 1.4-1.6.

14. The color filter structure as claimed in claim 8, wherein the first; second, and third dielectric layers comprise silicon dioxide.

15. The color filter structure as claimed in claim 8, further comprising a third dielectric layer as a base layer, wherein the pair of first colored patterns are formed over the third dielectric layer, and the first, second and third dielectric layers are below the third colored pattern.

16. The color filter structure as claimed in claim 8, wherein the first and second dielectric layers are below the third colored pattern, and the first dielectric layer is below the second colored pattern.

17. The color filter structure as claimed in claim 15, wherein the first and third dielectric layers are below the second colored pattern.

18. The color filter structure as claimed in claim 15, wherein the first dielectric layer is below the first colored pattern.

19. A method for fabricating a color filter structure, comprising:
   (a) forming a dielectric layer;
   (b) forming a colored layer over the dielectric layer;
   (c) forming a hard mask pattern over the colored layer;
   (d) patterning the colored layer by the hard mask pattern to form a colored pattern;
   (e) removing the hard mask pattern;
   (f) repeating steps (a)-(e); and
   (g) repeating steps (a)-(e).

20. The method as claimed in claim 19, wherein patterning the colored layer comprises using $O_2$ as an etching gas.

21. The method as claimed in claim 19, further comprising repeating the steps (a)-(e) to form a black matrix pattern.

* * * * *